United States Patent
Kohno et al.

(10) Patent No.: US 8,366,953 B2
(45) Date of Patent: Feb. 5, 2013

(54) PLASMA CLEANING METHOD AND PLASMA CVD METHOD

(75) Inventors: Masayuki Kohno, Amagasaki (JP); Tatsuo Nishita, Amagasaki (JP); Toshio Nakanishi, Amagasaki (JP)

(73) Assignee: Tokyo Electron Limited, Tokyo (JP)

(*) Notice: Subject to any disclaimer, the term of this patent is extended or adjusted under 35 U.S.C. 154(b) by 426 days.

(21) Appl. No.: 12/441,828

(22) PCT Filed: Sep. 18, 2007

(86) PCT No.: PCT/JP2007/068098
§ 371 (c)(1),
(2), (4) Date: Mar. 18, 2009

(87) PCT Pub. No.: WO2008/035678
PCT Pub. Date: Mar. 27, 2008

(65) Prior Publication Data
US 2009/0308840 A1 Dec. 17, 2009

(30) Foreign Application Priority Data
Sep. 19, 2006 (JP) ................. 2006-252446

(51) Int. Cl.
*B44C 1/22* (2006.01)
*G01L 21/30* (2006.01)
*G01R 31/00* (2006.01)
*C03C 15/00* (2006.01)
*H01L 21/302* (2006.01)
*H01L 21/461* (2006.01)

(52) U.S. Cl. .............. 216/37; 216/60; 216/67; 438/706; 438/710; 438/724

(58) Field of Classification Search ............ 216/60, 216/37, 67, 676; 134/1, 1.1, 1.2, 1.3; 438/710, 438/724, 706
See application file for complete search history.

(56) References Cited

U.S. PATENT DOCUMENTS
5,129,958 A * 7/1992 Nagashima et al. ......... 134/22.1
5,201,990 A * 4/1993 Chang et al. ................. 216/67
5,207,836 A * 5/1993 Chang ........................ 134/1
(Continued)

FOREIGN PATENT DOCUMENTS
JP 6 20975 1/1994
JP 7 201738 8/1995
(Continued)

OTHER PUBLICATIONS
Office Action issued Nov. 18, 2010, in Korean Patent Application No. 10-2009-7005392 (with partial English translation).

*Primary Examiner* — Allan Olsen
*Assistant Examiner* — Margaret D Klunk
(74) *Attorney, Agent, or Firm* — Oblon, Spivak, McClelland, Maier & Neustadt, L.L.P.

(57) ABSTRACT

A plasma cleaning method is performed in a plasma CVD apparatus for depositing a silicon nitride film on a surface of a target substrate, and includes a stage (S1) of supplying a cleaning gas containing $NF_3$ gas into a process container, thereby removing extraneous deposits formed on portions inside the process container; a stage (S2) of supplying a gas containing hydrogen gas into the process container and generating plasma thereof, thereby removing residual fluorine inside the process container; and a stage (S3) of supplying a gas containing a rare gas into the process container and generating plasma thereof, thereby removing residual hydrogen inside the process container.

14 Claims, 8 Drawing Sheets

U.S. PATENT DOCUMENTS

| | | | |
|---|---|---|---|
| 5,326,723 A * | 7/1994 | Petro et al. | 438/685 |
| 6,200,412 B1 * | 3/2001 | Kilgore et al. | 156/345.28 |
| 2003/0147075 A1 | 8/2003 | Otsuki et al. | |
| 2004/0028835 A1 * | 2/2004 | Lin | 427/535 |
| 2005/0260354 A1 * | 11/2005 | Singh et al. | 427/523 |
| 2006/0040066 A1 * | 2/2006 | Tsutae | 427/569 |
| 2006/0281323 A1 * | 12/2006 | Ohmi et al. | 438/710 |
| 2007/0108161 A1 * | 5/2007 | Murugesh et al. | 216/63 |
| 2007/0249171 A1 * | 10/2007 | Sung et al. | 438/706 |
| 2009/0035484 A1 * | 2/2009 | Kobayashi et al. | 427/579 |

FOREIGN PATENT DOCUMENTS

| | | | |
|---|---|---|---|
| JP | 2001 335937 | | 12/2001 |
| JP | 2001335937 A | * | 12/2001 |
| JP | 2002 371360 | | 12/2002 |
| JP | 2003 37105 | | 2/2003 |
| JP | 2003 293138 | | 10/2003 |
| JP | 2006 86325 | | 3/2006 |
| WO | WO 2004100246 A1 | * | 11/2004 |
| WO | WO 2006073152 A1 | * | 7/2006 |

* cited by examiner

PLASMA CLEANING METHOD AND PLASMA CVD METHOD

TECHNICAL FIELD

The present invention relates to a plasma cleaning method for cleaning the interior of a process container of a plasma CVD (Chemical Vapor Deposition) apparatus that is used for depositing a silicon nitride film on the surface of a target substrate, and also relates to a plasma CVD method.

BACKGROUND ART

Silicon nitride films are used as insulating films, protection films, and so forth in various semiconductor device. It is known that a silicon nitride film of this kind can be formed by plasma CVD or the like using a silicon-containing compound gas, such as silane ($SiH_4$), as a source gas and a nitrogen-containing compound gas, such as nitrogen or ammonia.

In a plasma CVD apparatus for performing plasma CVD as described above, as the film formation is repeated on target substrates, silicon nitride is deposited on portions inside the chamber other than the target substrates. If extraneous deposits thus formed on portions inside the chamber exceed a certain film thickness, the film formation performed in the plasma CVD apparatus is adversely affected. For example, the extraneous deposits formed on portions inside the chamber affect gas flows and/or thermal distribution inside the chamber, and may deteriorate the film formation rate and/or film formation uniformity. Further, particles may be generated from the extraneous deposits and deposited on the target substrate. In light of the problems described above, it is necessary to periodically perform cleaning inside the chamber to remove the extraneous deposits formed on portions inside the chamber. For this purpose, there has been proposed a plasma cleaning method for etching the interior of the chamber by use of plasma of a reactive gas containing a fluorine compound, such as $NF_3$, (for example, Jpn. Pat. Appln. KOKAI Publication No. 7-201738).

As disclosed in Jpn. Pat. Appln. KOKAI Publication No. 7-201738, plasma cleaning is typically arranged to use a cleaning gas (such as $NF_3$) of the type having an etching effect relative to extraneous deposits on portions inside the chamber and to dry-etch the extraneous deposits by plasma of the cleaning gas. However, where a fluorine-containing gas, such as $NF_3$ gas, is used for cleaning, it is necessary to remove residual fluorine inside the chamber because the residual fluorine adversely affects a film formation process subsequently performed. Accordingly, this patent document 1 describes such that a process using a gas containing $NF_3$ is followed by a stage of removing fluorine inside the chamber by use of plasma of a reducing gas containing $NH_3$.

The technique disclosed in Jpn. Pat. Appln. KOKAI Publication No. 7-201738 described above is arranged to use a stage of removing residual fluorine inside the chamber after $NF_3$ cleaning, but cannot be said to involve sufficient studies concerning conditions for performing the cleaning process at high throughput to swiftly remove residual fluorine while attaining a cleaning effect practically sufficient.

Further, where a cleaning process includes a plurality of stages, as in the technique described above, it is difficult to find the endpoints of the respective stages. If the cleaning is excessively performed due to erroneous determination of the endpoints, plasma of a cleaning gas etches members inside the chamber, such as a worktable (susceptor) for placing a target substrate thereon and a cover ring for guiding the target substrate, and causes plasma damage thereon, which shortens the service life of the members. Particularly, if the cleaning is performed for a longer time to enhance the cleaning effect, the plasma damage becomes larger and thereby deteriorates the throughput. In reverse, if conditions are set to suppress the plasma damage and thereby increase the throughput, cleaning becomes insufficient, thereby generates particles, and adversely affects the film formation.

DISCLOSURE OF INVENTION

An object of the present invention is to provide a plasma cleaning method that can reliably decrease residual fluorine at high throughput.

Another object of the present invention is to provide a plasma cleaning method that allows the endpoint of cleaning to be easily found and can suppress plasma damage to components inside a chamber to the minimum.

Another object of the present invention is to provide a plasma CVD method including the plasma cleaning method.

According to a first aspect of the present invention, there is provided a plasma cleaning method for performing cleaning by use of plasma of a cleaning gas inside a process container with extraneous deposits deposited therein in a plasma processing apparatus, the method comprising: supplying a cleaning gas containing $NF_3$ gas into the process container and generating plasma thereof, thereby removing extraneous deposits formed on portions inside the process container; and supplying a gas containing hydrogen gas into the process container and generating plasma thereof, thereby removing residual fluorine inside the process container after removing the extraneous deposits.

In the first aspect, the method may further comprise supplying a gas containing a rare gas into the process container and generating plasma thereof, thereby removing residual hydrogen inside the process container after removing the fluorine.

The method may be arranged to repeatedly perform removing the fluorine and removing the hydrogen.

The method may comprise monitoring plasma light emission to perform endpoint detection in each of removing the extraneous deposits, removing the fluorine, and removing the hydrogen.

The plasma processing apparatus may be a plasma CVD apparatus arranged to supply microwaves through a planar antenna including a plurality of slots into the process container to generate plasma so as to deposit a silicon nitride film on a surface of a target substrate.

According to a second aspect of the present invention, there is provided a plasma cleaning method for performing cleaning by use of plasma of a cleaning gas inside a process container with extraneous deposits deposited therein in a microwave processing apparatus provided with a planar antenna including a plurality of slots, the method comprising: supplying a cleaning gas containing $NF_3$ gas into the process container; supplying microwaves through the planar antenna into the process container, thereby generating plasma of the cleaning gas and thus generating F radicals inside the process container; causing the F radicals to react with extraneous deposits formed on portions inside the process container, thereby evaporating the extraneous deposits; and exhausting evaporated components of the extraneous deposits from the process container.

In the second aspect, the method preferably further comprises supplying a gas containing hydrogen gas into the process container and generating plasma thereof, thereby removing residual fluorine inside the process container after exhausting the evaporated components of the extraneous deposits.

According to a third aspect of the present invention, there is provided a plasma CVD method for depositing a silicon nitride film on a surface of a target substrate inside a process container of a plasma CVD apparatus, the method comprising: generating plasma of a gas containing a nitrogen-containing gas and a silicon-containing gas supplied into the process container, thereby depositing a silicon nitride film on a surface of a target substrate by use of the plasma; supplying a cleaning gas containing $NF_3$ gas into the process container and generating plasma thereof, thereby removing extraneous deposits formed on portions inside the process container; supplying a gas containing hydrogen gas into the process container and generating plasma thereof, thereby removing residual fluorine inside the process container after removing the extraneous deposits; and supplying a gas containing a rare gas into the process container and generating plasma thereof, thereby removing residual hydrogen inside the process container after removing the fluorine.

In the third aspect, the method may be arranged to repeatedly perform removing the fluorine and removing the hydrogen.

The method may further comprise performing the plasma CVD process again after removing the hydrogen.

According to a fourth aspect of the present invention, there is provided a storage medium that stores a program for execution on a computer to control a plasma processing apparatus when performing cleaning by use of plasma of a cleaning gas inside a process container of the plasma processing apparatus, wherein, when executed, the program causes the computer to control the plasma processing apparatus to conduct a plasma cleaning method that comprises supplying a cleaning gas containing $NF_3$ gas into the process container and generating plasma thereof, thereby removing extraneous deposits formed on portions inside the process container, and supplying a gas containing hydrogen gas into the process container and generating plasma thereof, thereby removing residual fluorine inside the process container after removing the extraneous deposits.

According to a fifth aspect of the present invention, there is provided a plasma processing apparatus comprising: a process container configured to be vacuum-exhausted and to process a target object by use of plasma; a planar antenna including a plurality of slots configured to supply microwaves into the process container; a gas supply mechanism configured to supply a cleaning gas into the process container; and a control section configured to control respective components to conduct a plasma cleaning method that comprises supplying a cleaning gas containing $NF_3$ gas into the process container and generating plasma thereof, thereby removing extraneous deposits formed on portions inside the process container, and supplying a gas containing hydrogen gas into the process container and generating plasma thereof, thereby removing residual fluorine inside the process container after removing the extraneous deposits.

The present invention comprises supplying a cleaning gas containing $NF_3$ gas into a process container and generating plasma thereof, thereby removing extraneous deposits, and then supplying a gas containing hydrogen gas into the process container and generating plasma thereof, thereby removing residual fluorine. With this arrangement, residual fluorine in the plasma CVD process container is reliably decreased at high throughput, and the film formed on the substrate is prevented from being contaminated with fluorine.

Further, where plasma light emission is monitored to perform endpoint detection for each of the extraneous deposit removing stage, fluorine removing stage, and hydrogen removing stage, the time periods of the stages can be properly managed. Consequently, plasma damage due to a plasma process excessively performed is suppressed to the minimum while the cleaning is performed at high throughput.

Further, where the plasma cleaning method is incorporated into a plasma CVD process for forming a silicon nitride film in the process of manufacturing various semiconductor devices, the chamber is prevented from falling into a state with excessive extraneous deposits formed therein. Consequently, the uniformity of the film formation in the plasma CVD process is improved, while particle generation is suppressed to the minimum, so that the process can be continuously and stably performed on respective target substrates.

BEST MODE FOR CARRYING OUT THE INVENTION

Figure 1:
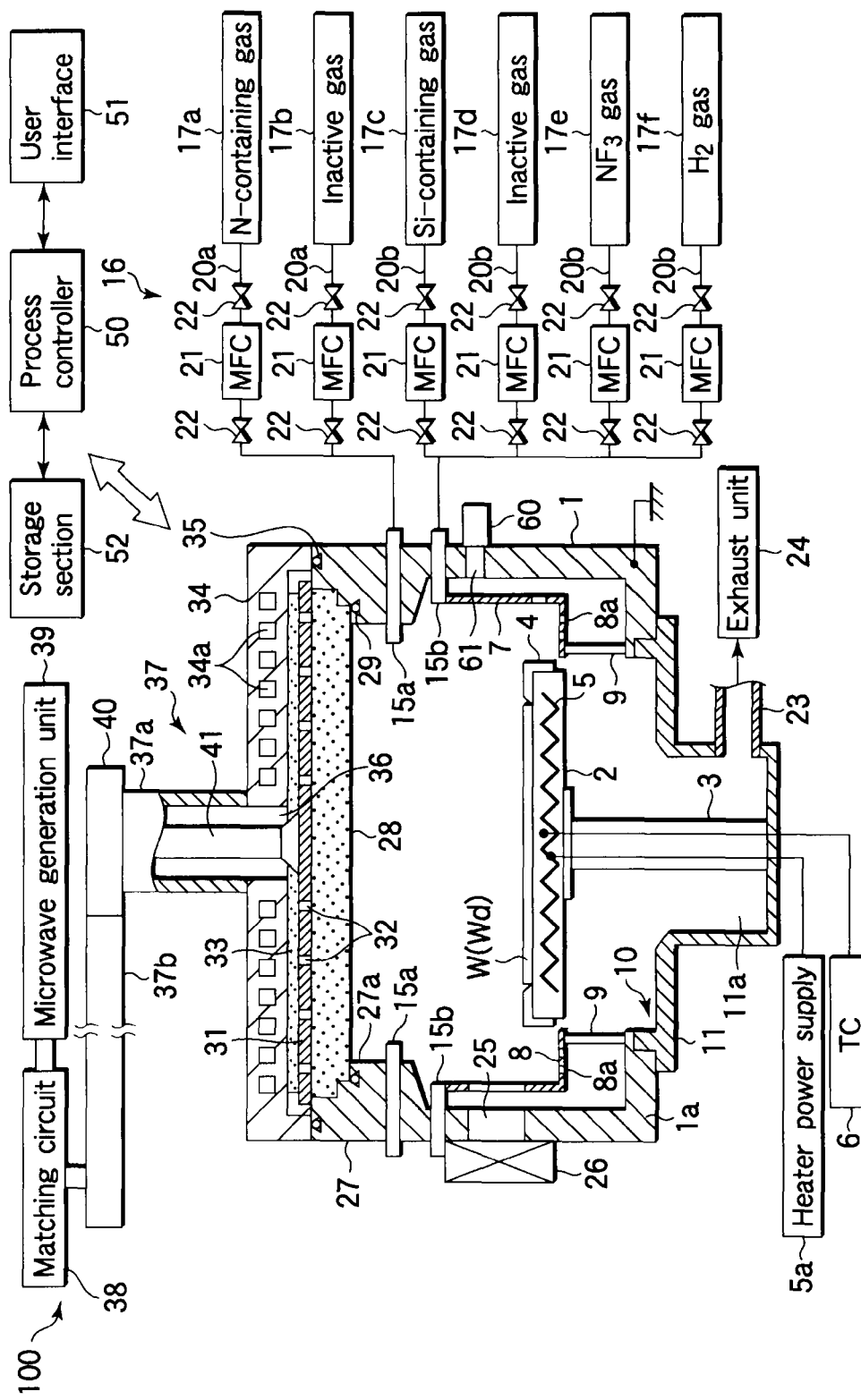
FIG. 1 This is a sectional view schematically showing an example of a plasma processing apparatus suitable for performing a method according to the present invention.

An embodiment of the present invention will now be described in detail with reference to the accompanying drawings. FIG. 1 is a sectional view schematically showing an example of a plasma processing apparatus suitable for performing a plasma cleaning method and a plasma CVD method according to the present invention. This plasma processing apparatus 100 is arranged as a processing apparatus of the RLSA (Radial Line Slot Antenna) microwave plasma type, in which microwaves are supplied from a planar antenna having a plurality of slots into a process chamber to generate plasma. In this case, microwave excitation plasma is generated with a high density and a low electron temperature, such as a plasma density of $1 \times 10^{10}$ to $5 \times 10^{12}/cm^3$ and a low electron temperature of 0.7 to 2 eV, and so a process can be performed with very little damage to the film. Accordingly, apparatuses of this type are preferably utilized for processes, such as formation of a silicon nitride film by plasma CVD, in manufacturing various semiconductor devices.

This plasma processing apparatus 100 includes an essentially cylindrical chamber 1, which is airtight and grounded. The chamber 1 may have a rectangular shape. The bottom wall 1a of the chamber 1 has a circular opening 10 formed essentially at the center, and is provided with an exhaust chamber 11 communicating with the opening 10 and extending downward. The exhaust chamber 11 is connected to an exhaust unit 24 through an exhaust line 23.

The chamber 1 is provided with a worktable 2 disposed therein and made of a ceramic with a high thermal conductivity, such as AlN, for supporting a target substrate, such as a silicon wafer (which will be simply referred to as "wafer", hereinafter) W, in a horizontal state. The worktable 2 is supported by a cylindrical support member 3 made of a ceramic, such as AlN, and extending upward from the center of the bottom of the exhaust chamber 11. The worktable 2 is provided with a cover ring 4 covering the outer edge of the worktable 2 and configured to guide the wafer W. The cover ring 4 is made of a dielectric material, such as quartz, AlN, $Al_2O_3$, or SiN.

The worktable 2 is provided with a heater 5 of the resistance heating type embedded therein. The heater 5 is supplied with a power from a heater power supply 5a to heat the worktable 2, thereby uniformly heating the target substrate or wafer W. Further, a thermocouple 6 is connected to the worktable 2, so that heating temperature for the wafer W can be controlled within a range of, e.g., from room temperature to 900° C. The worktable 2 is provided with wafer support pins (not shown) that can project and retreat relative to the surface of the worktable 2 to support the wafer W and move it up and down.

The inner wall of the chamber 1 is covered with a cylindrical quartz liner 7 to prevent metal contamination due to the construction material of the chamber. An annular baffle plate 8 having a number of holes 8a is disposed around the worktable 2 to uniformly exhaust gas from inside the chamber 1. The baffle plate 8 is supported by a plurality of support rods 9.

Gas feed parts 15a and 15b, each of which has an annular structure, are attached to an upper plate 27 described later and the sidewall of the chamber 1 on upper and lower sides, respectively. The gas feed parts 15a and 15b are connected to a gas supply system 16 for supplying a film formation source gas, a plasma excitation gas, and a cleaning gas. Each of the gas feed parts 15a and 15b may have a nozzle or shower structure.

For example, the gas supply system 16 includes a nitrogen-containing gas supply source 17a, an inactive gas supply source 17b, an Si-containing gas supply source 17c, an inactive gas supply source 17d, an $NF_3$ gas supply source 17e, and hydrogen gas supply source 17f. The nitrogen-containing gas supply source 17a and inactive gas supply source 17b are connected to the upper gas feed part 15a. The Si-containing gas supply source 17c, inactive gas supply source 17d, $NF_3$ gas supply source 17e, and hydrogen gas supply source 17f are connected to the lower gas feed part 15b. The $NF_3$ gas may be connected and supplied to the upper gas feed part 15a.

The Si-containing gas used as a film formation source gas is silane ($SiH_4$), disilane ($Si_2H_6$), or TSA (trisilylamine), for example, and particularly preferably disilane ($Si_2H_6$). The nitrogen-containing gas used as another film formation source gas is $N_2$, ammonia, or a hydrazine derivative, such as MMH (monomethylhydrazine), for example. The inactive gas is $N_2$ gas or rare gas, for example. The rare gas used as a plasma excitation gas is Ar gas, Kr gas, Xe gas, or He gas, for example, and particularly preferably Ar gas in light of economical efficiency and plasma stability.

The $NF_3$ gas and hydrogen gas are used along with the rare gas to serve as a cleaning gas for cleaning the interior of the chamber 1 of the plasma processing apparatus 100.

The nitrogen-containing gas and inactive gas are supplied from the nitrogen-containing gas supply source 17a and inactive gas supply source 17b through respective gas lines 20 to the gas feed part 15a, and are delivered from the gas feed part 15a into the chamber 1. On the other hand, the Si-containing gas, inactive gas, $NF_3$ gas, and hydrogen gas are supplied through respective gas lines 20 to the gas feed part 15b, and are delivered from the gas feed part 15b into the chamber 1. Each of the gas lines 20a and 20b connected to the respective gas supply sources is provided with a mass-flow controller 21 and two switching valves 22 one on either side of the controller 21 to switch gases to be supplied and to control the flow rate of each gas.

The sidewall of the exhaust chamber 11 is connected to the exhaust unit 24 including a high speed vacuum pump through an exhaust line 23. The exhaust unit 24 can be operated to uniformly exhaust gas from inside the chamber 1 through the baffle plate 8 into the space 11a of the exhaust chamber 11, and then out of the exhaust chamber 11 through the exhaust line 23. Consequently, the inner pressure of the chamber 1 can be decreased at a high speed to a predetermined vacuum level, such as 0.133 Pa.

The chamber 1 has a transfer port 25 formed in the sidewall and provided with a gate valve 26 for opening/closing the transfer port 25. The wafer W is transferred between the plasma processing apparatus 100 and an adjacent transfer chamber (not shown) through the transfer port 25.

The top of the chamber 1 is opened and connected to the annular upper plate 27 formed along the opening. The lower side of the inner periphery of the upper plate 27 projects inward into the space inside the chamber and forms an annular support portion 27a. A microwave transmission plate 28 is airtightly mounted on the support portion 27a through a seal member 29. The microwave transmission plate 28 is made of a dielectric material, such as quartz or a ceramic, e.g., $Al_2O_3$ or AlN, to transmit microwaves. The interior of the chamber 1 is thus held airtight.

A circular planar antenna plate 31 is disposed above the microwave transmission plate 28 to face the worktable 2. The planar antenna plate 31 may be formed of a rectangular plate in place of the circular plate. The planar antenna plate 31 is fixed to the top of the sidewall of the chamber 1. The planar antenna plate 31 is formed of, e.g., a copper plate or aluminum plate with the surface plated with gold or silver. The planar antenna plate 31 has a number of slot-like microwave radiation holes 32 for radiating microwaves, formed therethrough and arrayed in a predetermined pattern.

Figure 2:
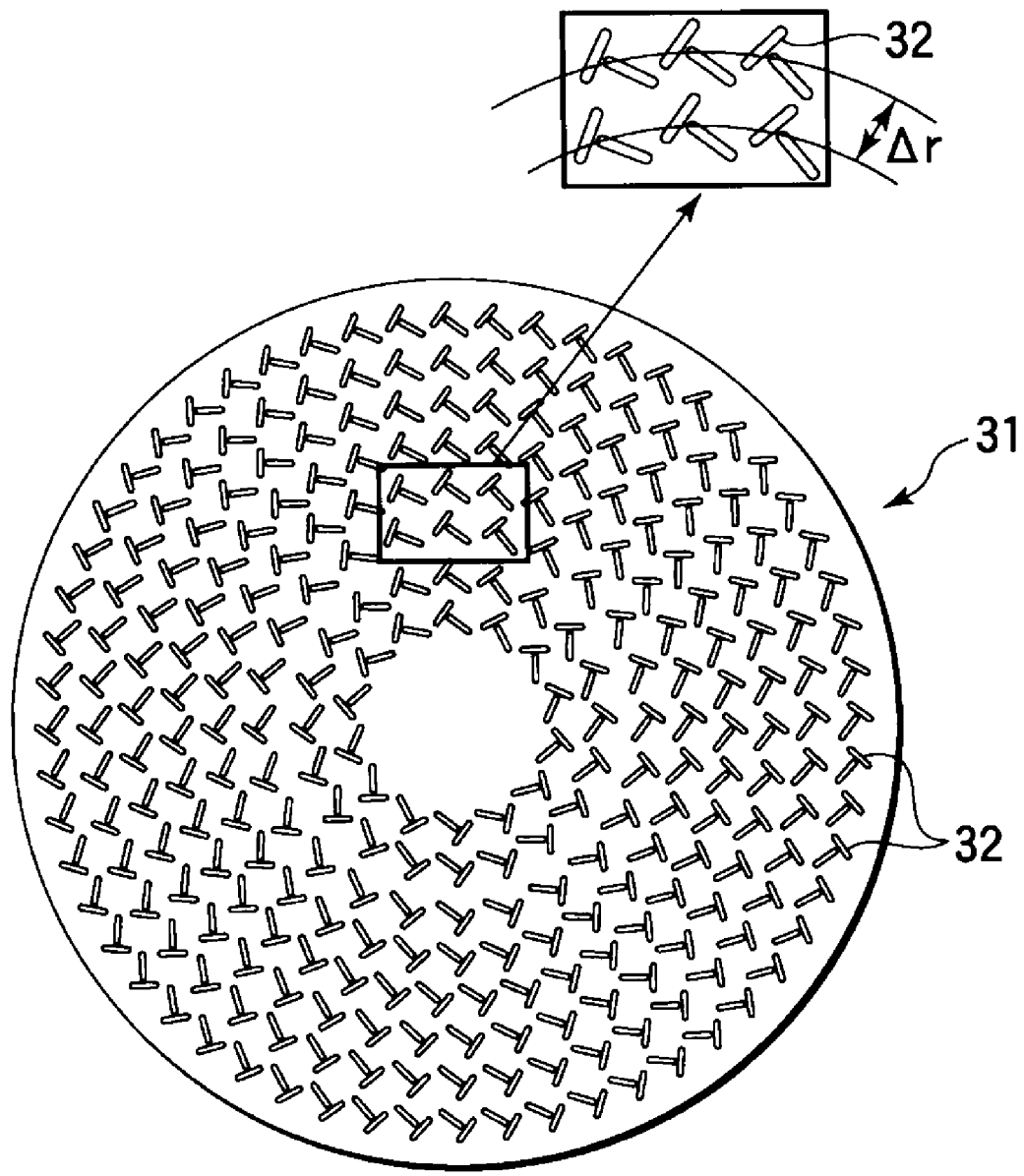
FIG. 2 This is a view showing the structure of a planar antenna plate.

For example, as shown in FIG. 2, the microwave radiation holes 32 have a long narrow shape and are arranged to form a number of pairs of holes 32, wherein the microwave radiation holes 32 are typically arranged such that the pairs of holes 32 form T-shapes and are arrayed on a plurality of concentric circles. The length and array intervals of the microwave radiation holes 32 are determined in accordance with the wavelength ($\lambda g$) of microwaves. For example, the intervals of the microwave radiation holes 32 are set to be $\lambda g/4$, $\lambda g/2$, or $\lambda g$. In FIG. 2, the interval between adjacent microwave radiation holes 32 respectively on two concentric circles is expressed with $\Delta r$. The microwave radiation holes 32 may have another shape, such as a circular shape or arc shape. The array pattern of the microwave radiation holes 32 is not limited to a specific one, and, for example, it may be spiral or radial other than concentric.

A wave-retardation body 33 having a dielectric constant larger than that of vacuum is disposed on the top of the planar antenna plate 31. The wave-retardation body 33 shortens the wavelength of microwaves to adjust plasma, because the wavelength of microwaves becomes longer in a vacuum condition. The planar antenna plate 31 may be set in contact with or separated from the microwave transmission plate 28. Similarly, the wave-retardation body 33 may be set in contact with or separated from the planar antenna plate 31. However, these members are preferably set in contact with the adjacent one.

The planar antenna plate 31 and wave-retardation body 33 are covered with a shield cover 34 located at the top of the chamber 1 and made of a metal material, such as aluminum or stainless steel, and serving as a waveguide tube. A seal member 35 is interposed between the top of the chamber 1 and the shield cover 34 to seal this portion. The shield cover 34 is provided with a plurality of cooling water passages 34a formed therein. Cooling water is supplied to flow through the cooling water passages and thereby cool the shield cover 34, wave-retardation body 33, planar antenna plate 31, and transmission plate 28. The shield cover 34 is grounded.

The shield cover 34 has an opening 36 formed at the center of the upper wall and connected to a waveguide tube 37. The waveguide tube 37 is connected to a microwave generation unit 39 for generating microwaves at one end through a matching circuit 38. The microwave generation unit 39 generates microwaves with a frequency of, e.g., 2.45 GHz, which are transmitted through the waveguide tube 37 to the planar antenna plate 31. The microwaves may have a frequency of 8.35 GHz or 1.98 GHz.

The waveguide tube 37 includes a coaxial waveguide tube 37a having a circular cross-section and extending upward from the opening 36 of the shield cover 34, and a rectangular waveguide tube 37b connected to the upper end of the coaxial waveguide tube 37a through a mode transducer 40 and extending in a horizontal direction. Microwaves are propagated in a TE mode through the rectangular waveguide tube 37b, and are then turned into a TEM mode by the mode transducer 40 interposed between the rectangular waveguide tube 37b and coaxial waveguide tube 37a. The coaxial waveguide tube 37a includes an inner conductive body 41 extending at the center, which is connected and fixed to the center of the planar antenna plate 31 at the lower end. Consequently, microwaves are efficiently and uniformly propagated from the inner conductive body 41 of the coaxial waveguide tube 37a in the radial direction to the planar antenna plate 31.

Further, the plasma processing apparatus 100 is provided with a detecting unit 60 on the sidewall of the chamber 1 to detect light emission of plasma inside the chamber 1. The detecting unit 60 includes a light-receiving portion and a spectroscopic measuring portion, such as a monochromator, (they are not shown), so that the light emission of a predetermined wavelength from plasma generated inside the chamber 1 can be monitored through a window 61 formed in the sidewall of the chamber 1. Although the cylindrical quartz liner 7 is disposed inside the chamber 1, the light emission intensity of radicals in the plasma can be measured through the window 61 and liner 7. The location of the detecting unit 60 is not limited to a specific one, but can be set anywhere as long as the measurement can be stably performed.

The respective components of the plasma processing apparatus 100 are connected to and controlled by a process controller 50 comprising a microprocessor (computer). The process controller 50 is connected to a user interface 51 including, e.g. a keyboard and a display, wherein the keyboard is used for an operator to input commands for operating the plasma processing apparatus 100, and the display is used for showing visualized images of the operational status of the plasma processing apparatus 100.

Further, the process controller 50 is connected to a storage section 52 that stores recipes containing control programs (software), process condition data, and so forth recorded therein, for the process controller 50 to control the plasma processing apparatus 100 so as to perform various processes.

A required recipe is retrieved from the storage section 52 and executed by the process controller 50 in accordance with an instruction or the like input through the user interface 51. Consequently, the plasma processing apparatus 100 can perform a predetermined process under the control of the process controller 50. The recipes containing control programs and process condition data may be used while they are stored in a computer readable storage medium, such as a CD-ROM, hard disk, flexible disk, or flash memory. Alternatively, the recipes may be used online while they are transmitted from another apparatus through, e.g., a dedicated line, as needed.

Further, the process controller 50 is connected to the detecting unit 60 by connecting means (not shown), and is configured to analyze the light emission of a predetermined wavelength from plasma detected by the detecting unit 60 and to judge the endpoints of the respective stages of the cleaning process. Further, the process controller 50 is configured to transmit instructions to, e.g., automatically switch the stages of the cleaning process and to shows completion of the stages on the display of the user interface 51.

The plasma processing apparatus 100 structured as described above can proceed with a plasma process at a low temperature of 800° C. or less and to be free from damage on underlying films and so forth. Further, the apparatus 100 can provide good plasma uniformity to realize a uniform process.

Figure 3:
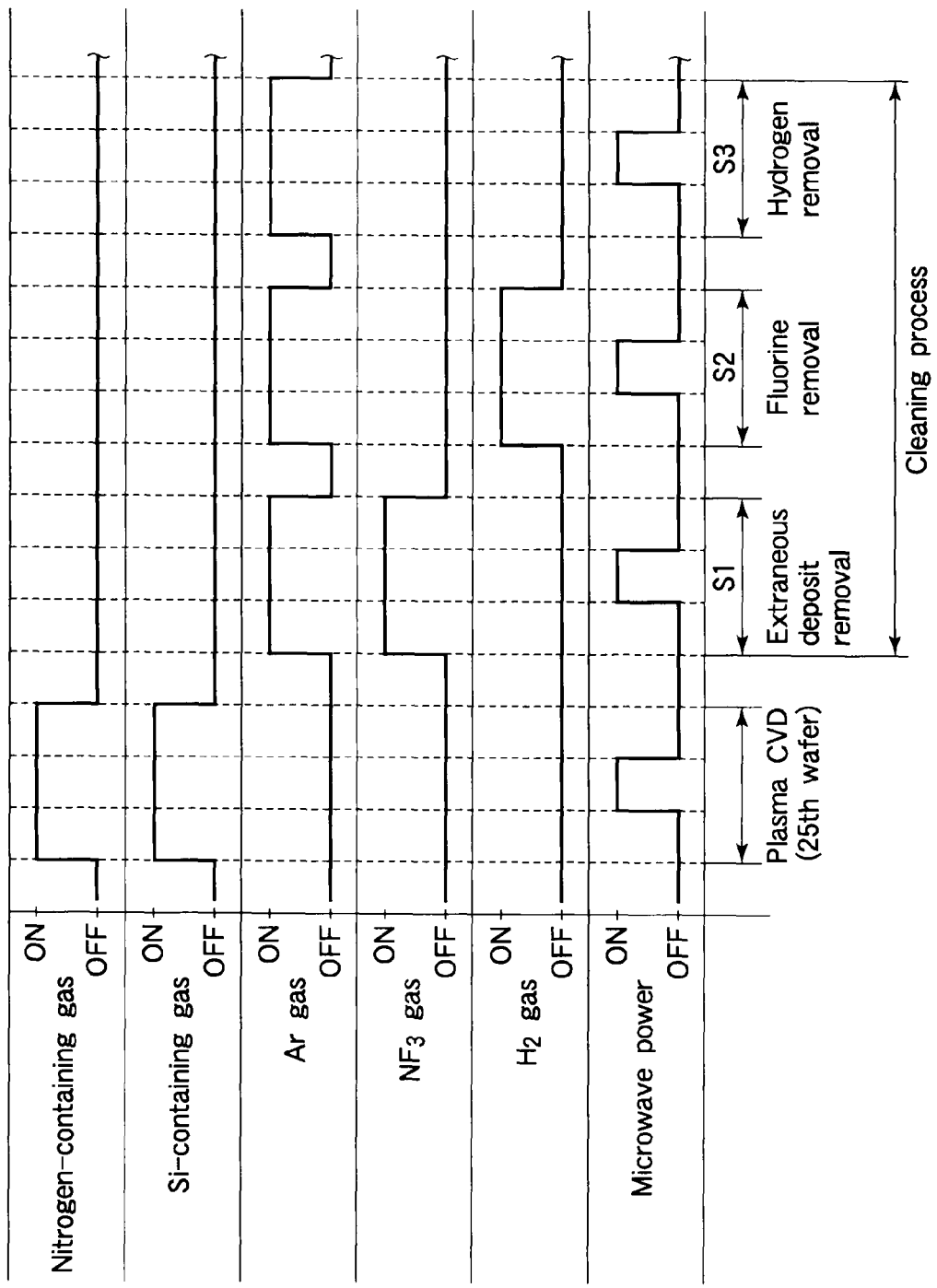
FIG. 3 This is a timing chart showing a plasma CVD process and a plasma cleaning process continuously performed thereafter.

Next, an explanation will be given of a plasma CVD process and a plasma cleaning process performed in the plasma processing apparatus 100. FIG. 3 is a timing chart showing a plasma CVD process and a plasma cleaning process continuously performed thereafter. FIG. 3 shows the timing of switching gases and the timing of turning on/off microwave output (ON/OFF), in the plasma CVD process performed on the last wafer of one lot (25 wafers) and the plasma cleaning process continuously performed thereafter.

In the plasma CVD process, a silicon nitride film is deposited on the surface of the wafer W by a plasma CVD method, which may be performed in accordance with the following sequence.

At first, the gate valve 26 is opened, and a wafer W is loaded through the transfer port 25 into the chamber 1 and placed on the worktable 2. Then, the nitrogen-containing gas and silicon-containing gas are supplied at predetermined flow rates from the nitrogen-containing gas supply source 17a and Si-containing gas supply source 17c of the gas supply system 16 through the gas feed parts 15a and 15b, respectively, into the chamber 1.

Then, microwaves are supplied from the microwave generation unit 39 through the matching circuit 38 into the waveguide tube 37. The microwaves are supplied through the rectangular waveguide tube 37b, mode transducer 40, and coaxial waveguide tube 37a in this order, and further through the inner conductive body 41 to the planar antenna plate 31. Then, the microwaves are radiated from the slots of the planar antenna plate 31 through the transmission plate 28 into the space above the wafer W within the chamber 1. The microwaves are propagated in a TE mode through the rectangular waveguide tube 37b, and are then turned from the TE mode into a TEM mode by the mode transducer 40 and propagated in the TEM mode through the coaxial waveguide tube 37a to the planar antenna plate 31. At this time, the microwave output is set to be about 500 to 3,000 W, for example.

When the microwaves are radiated from the planar antenna plate 31 through the transmission plate 28 into the chamber 1, an electromagnetic field is formed inside the chamber 1, and the nitrogen-containing gas and silicon-containing gas are thereby turned into plasma. Since microwaves are radiated from a number of slots of the planar antenna plate 31, i.e., microwave radiation holes 32, this microwave excitation plasma has a high density of about $1 \times 10^{10}$ to $5 \times 10^{12}/cm^3$, and a low electron temperature of about 1.2 eV or less near the wafer W. The microwave excitation plasma thus generated causes less plasma damage to the underlying films due to ions and so forth. Dissociation of the source gas proceeds in the plasma, and activated species of SiH, NH, N, and so forth react with each other to deposit a thin film of silicon nitride $Si_xN_y$ (wherein "x" and "y" are not necessarily determined by stoichiometry but take on different values depending on the conditions) on the surface of the wafer W, the inner surface of the chamber, and the surface of members inside the chamber.

Where the nitrogen-containing gas is $NH_3$ gas and the silicon-containing gas is $Si_2H_6$ gas in the plasma CVD film formation, the flow rate of $NH_3$ gas is preferably set to be 100 to 3,000 mL/min (sccm), and more preferably to be 400 to 1,000 mL/min (sccm), and the flow rate of $Si_2H_6$ gas is preferably set to be 1 to 30 mL/min (sccm), and more preferably to be 5 to 20 mL/min (sccm). Further, where Si2H6 gas and $NH_3$ gas are used, the process pressure is preferably set to be 13.3 to 400 Pa, and more preferably to be 40 to 133.3 Pa. Further, the heating temperature of the worktable 2, i.e., the process temperature of the plasma CVD, is preferably set to be 300° C. or more, and more preferably to be 400 to 500° C.

Where the nitrogen-containing gas is $N_2$ gas and the silicon-containing gas is $Si_2H_6$ gas, the flow rate of $N_2$ gas is preferably set to be 100 to 3,000 mL/min (sccm), and more preferably to be 800 to 2,000 mL/min (sccm), and the flow rate of $Si_2H_6$ gas is preferably set to be 1 to 30 mL/min (sccm), and more preferably to be 1 to 10 mL/min (sccm). Further, where Si2H6 gas and N2 gas are used, the process pressure is preferably set to be 1.3 to 667 Pa, and more preferably to be 2.6 to 133.3 Pa. Further, the heating temperature of the worktable 2, i.e., the process temperature of the plasma CVD, is preferably set to be 300° C. or more, and more preferably to be 400 to 600° C.

Figure 4:
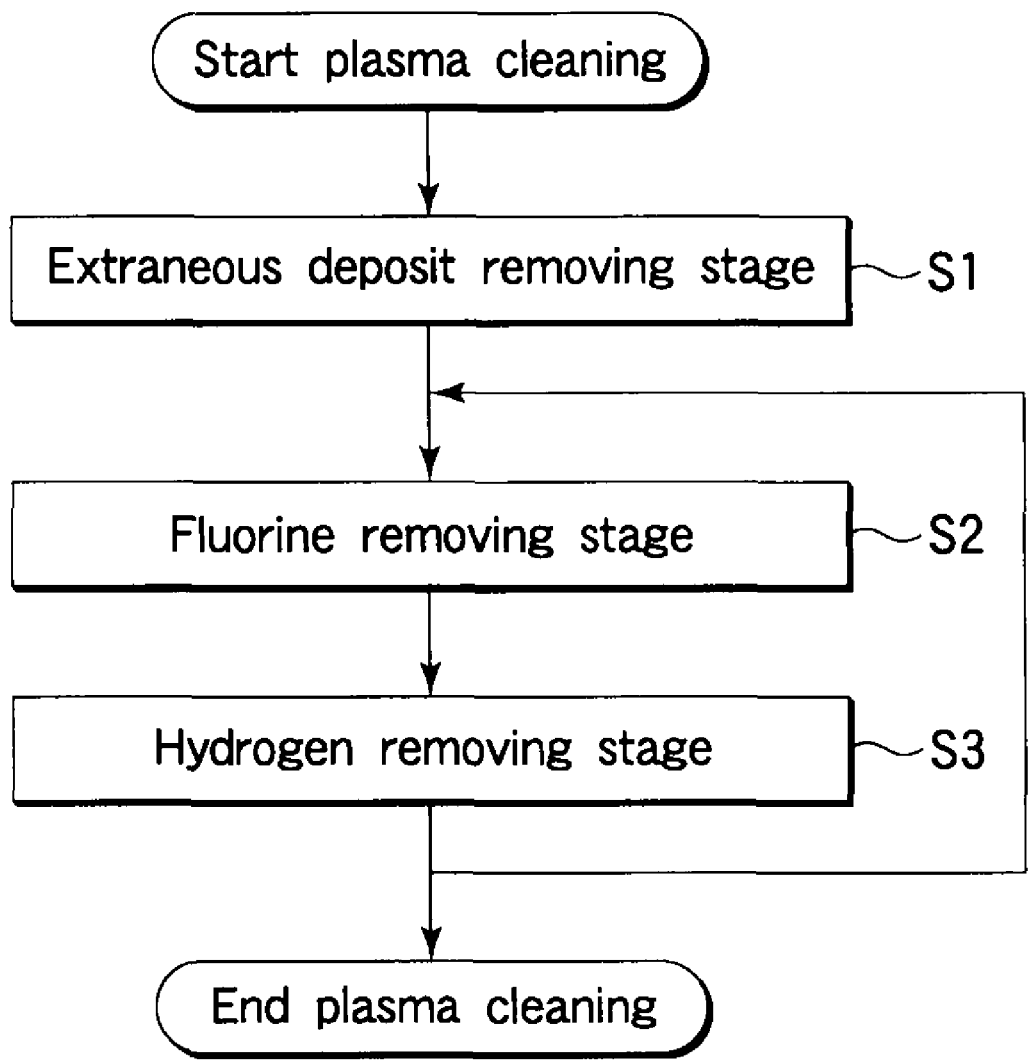
FIG. 4 This is a flow chart showing an example of the process sequence of the plasma cleaning process.

Thereafter, plasma cleaning is performed inside the chamber 1 of the plasma processing apparatus 100. The plasma cleaning process may be preformed in accordance with steps S1 to S3 shown in FIG. 4. At first, the extraneous deposits described above on portions inside the chamber 1 are removed in the step S1, and then conditioning of the interior of the chamber 1 is performed in the steps S2 and S3. The contents of the respective steps will be explained in detail below.

At first, the gate valve 26 is opened, and a dummy wafer Wd is loaded through the transfer port 25 into the chamber 1 and placed on the worktable 2. The dummy wafer Wd may be not used. Then, Ar gas and $NF_3$ gas are supplied at predetermined flow rates from the inactive gas supply sources 17b and 17d and $NF_3$ gas supply source 17e of the gas supply system 16 through the gas feed parts 15a and 15b into the chamber 1. In this embodiment, the Ar gas is supplied through both of the upper and lower gas feed parts 15a and 15b, so that plasma is uniformly generated inside the chamber 1, and the cleaning efficiency is thereby enhanced.

Then, microwaves are supplied from the microwave generation unit 39 through the same route as that described above into the space above the dummy wafer Wd within the chamber 1. At this time, the microwave output is set at a power density of, e.g., 1.67 to 4.18 W/cm², which corresponds to an absolute value of about 2,000 to 5,000 W for a 300-mm wafer. When the microwaves are radiated from the planar antenna plate 31 through the transmission plate 28 into the chamber 1, an electromagnetic field is formed inside the chamber 1, and the Ar gas and $NF_3$ gas are thereby turned into plasma. The $NF_3$ gas plasma generates F radicals (atomic fluorine) serving as radicals having an etching effect, so that the extraneous deposits ($Si_xN_y$) on portions inside the chamber 1 are etched and removed by the F radicals.

In the step S1 serving as an extraneous deposit removing stage, the flow rate of $NF_3$ gas is preferably set to be 200 to 1,000 mL/min (sccm), and more preferably to be 400 to 600 mL/min (sccm), and the flow rate of Ar gas as the total of those through the gas feed parts 15a and 15b is preferably set to be 200 to 1,000 mL/min (sccm), and more preferably to be 400 to 800 mL/min (sccm). Further, the process pressure is preferably set to be 40 to 133.3 Pa, and more preferably to be 66.7 to 106.6 Pa. Further, the process temperature is preferably set to be 300° C. or more, and more preferably to be 400 to 600° C.

After the elapse of a predetermined time, the supply of microwaves from the microwave generation unit 39 is stopped, and then the supply of gases from the inactive gas supply sources 17b and 17d and $NF_3$ gas supply source 17e is stopped, whereby the process of the step S1 is ended. The step S1 serving as an extraneous deposit removing stage is arranged to use plasma of a process gas containing $NF_3$ gas, so that the extraneous deposits (SiN) on portions inside the chamber 1 are efficiently removed.

Then, a fluorine removing stage is performed to remove residual fluorine generated inside the chamber 1 by the extraneous deposit removing stage using $NF_3$ gas (step S2). Specifically, at first, Ar gas and $H_2$ gas are supplied at predetermined flow rates from the inactive gas supply sources 17b and 17d and hydrogen gas supply source 17f of the gas supply system 16 through the gas feed parts 15a and 15b into the chamber 1. Also in this case, the Ar gas is supplied through both of the upper and lower gas feed parts 15a and 15b, so that plasma is uniformly generated inside the chamber 1.

Then, microwaves are supplied from the microwave generation unit 39 through the same route as that described above into the space above the dummy wafer Wd within the chamber 1. At this time, the microwave output is set at a power density of, e.g., 0.41 to 2.51 W/cm², which corresponds to an absolute value of about 500 to 3,000 W for a 300-mm wafer. When the microwaves are radiated from the planar antenna plate 31 through the transmission plate 28 into the chamber 1, an electromagnetic field is formed inside the chamber 1, and the Ar gas and $H_2$ gas are thereby turned into plasma. H ions and radicals thus generated react with residual fluorine inside the chamber 1 and generate HF, which is exhausted through the exhaust line 23. In this way, the residual fluorine inside the chamber 1 is removed. In this case, plasma is preferably generated by a lower output as compared to the extraneous deposit removing stage, so that the damage to the interior of the chamber is smaller.

In the step S2 serving as a fluorine removing stage, the flow rate of $H_2$ gas is preferably set to be 10 to 1,000 mL/min (sccm), and more preferably to be 30 to 200 mL/min (sccm), and the flow rate of Ar gas as the total of those through the gas feed parts 15a and 15b is preferably set to be 50 to 2,000 mL/min (sccm), and more preferably to be 600 to 1,200 mL/min (sccm). The $H_2$/Ar flow rate ratio is preferably set to be 0.005 to 2, and more preferably to be 0.0025 to 0.33. Further, the process pressure is preferably set to be 6.7 to 133.3 Pa, and more preferably to be 13.3 to 40 Pa. Further, the process temperature is preferably set to be 300° C. or more, and more preferably to be 400 to 600° C.

After the elapse of a predetermined time from the start of the fluorine removing process, the supply of microwaves from the microwave generation unit 39 is stopped, and then the supply of gases from the inactive gas supply sources 17b and 17d and hydrogen gas supply source 17f is stopped. The step S2 serving as a fluorine removing stage is arranged to use plasma of a process gas containing hydrogen gas, so that residual fluorine inside the chamber 1 is efficiency and swiftly exhausted in the form of HF. Consequently, when a silicon nitride film is formed on a wafer W thereafter, the film is prevented from being contaminated with fluorine and the process can be performed at high throughput.

In the step S2 serving as a fluorine removing stage, the ON/OFF of the microwave output is preferably switched at predetermined time intervals, such that a cyclic process is performed while plasma of Ar gas and $H_2$ gas is intermittently generated at intervals of, e.g., 10 to 360 seconds inside the chamber 1. In this case, the plasma may be turned on and off while the Ar gas and $H_2$ gas are kept flowing, or the plasma generation and purging may be alternately performed, or the plasma generation and vacuum-exhaust may be alternately performed while the gases are turned on and off along with the plasma.

Then, a hydrogen removing stage is performed to remove residual hydrogen inside the chamber 1 (step S3) Specifically, at first, Ar gas is supplied at predetermined flow rates from the inactive gas supply sources 17b and 17d of the gas supply system 16 through the gas feed parts 15a and 15b into the chamber 1. Also in this case, the Ar gas is supplied through both of the upper and lower gas feed parts 15a and 15b, so that plasma is uniformly generated inside the chamber 1.

Then, microwaves are supplied from the microwave generation unit 39 through the same route as that described above into the space above the dummy wafer Wd within the chamber 1. At this time, the microwave output is set at a power density of, e.g., 0.41 to 2.51 W/cm$^2$, which corresponds to an absolute value of about 500 to 3,000 W for a 300-mm wafer. When the microwaves are radiated from the planar antenna plate 31 through the transmission plate 28 into the chamber 1, an electromagnetic field is formed inside the chamber 1, and the Ar gas is thereby turned into plasma. The plasma of Ar gas provides a strong sputtering effect and thereby dissociates adsorbed hydrogen from the inner surface of the chamber and members inside the chamber. The hydrogen thus dissociated inside the chamber 1 is exhausted through the exhaust line 23. In this way, the residual hydrogen inside the chamber 1 is removed. In this case, plasma is preferably generated by a lower output as compared to the extraneous deposit removing stage, so that the damage to the interior of the chamber is smaller.

In the step S3 serving as a hydrogen removing stage, the ON/OFF of the microwave output is preferably switched at predetermined time intervals, such that a cyclic process is performed while plasma of Ar gas is intermittently generated at intervals of, e.g., 10 to 360 seconds inside the chamber 1. In this case, the plasma may be turned on and off while the Ar gas is kept flowing, or the plasma generation and purging may be alternately performed, or the plasma generation and vacuum-exhaust may be alternately performed while the gas is turned on and off along with the plasma.

In the step S3 serving as a hydrogen removing stage, the flow rate of Ar gas as the total of those through the gas feed parts 15a and 15b is preferably set to be 10 to 2,000 mL/min (sccm). Further, the process pressure is preferably set to be 6.7 to 133.3 Pa. Further, the process temperature is preferably set to be 300° C. or more, and more preferably to be 400 to 600° C.

After the elapse of a predetermined time, the supply of microwaves from the microwave generation unit 39 is stopped, and then the supply of gas from the inactive gas supply sources 17b and 17d is stopped. The step S3 serving as a hydrogen removing stage is arranged to use plasma of a process gas containing Ar gas, so that hydrogen adsorbed on portions inside the chamber 1 is efficiently sputtered and dissociated and is then swiftly exhausted. Consequently, when a silicon nitride film is formed on a wafer W thereafter, the film is prevented from being contaminated with hydrogen and the process can be performed at high throughput.

As described above, the interior of the chamber 1 of the plasma processing apparatus 100 is sequentially processed by the stages using plasma of process gases containing $NF_3$ gas, hydrogen gas, and Ar gas, respectively, in accordance with the process sequence of the step S1 to step S3. Consequently, the interior of the chamber 1 is reliably cleaned at high throughput with little residual fluorine and hydrogen.

Further, in the plasma cleaning process according to this embodiment, each of the step S2 serving as a fluorine removing stage and the step S3 serving as a hydrogen removing stage is preferably repeated a predetermined number of times, such as one time or more, and preferably 1 to 20 times. In this case, fluorine and hydrogen can be reliably removed from inside the chamber 1.

Further, in the cleaning process, the light emission of a predetermined wavelength from plasma may be monitored in each of the stages of the step S1 to step S3. For example, the light emission intensity of SiN or atomic hydrogen of plasma generated inside the chamber 1 is measured by the detecting unit 60 in each of the stages of the step S1 to step S3. The detecting unit is configured to divide the light emission of plasma thus received into spectrums. In this embodiment, the light emission intensity of SiN or atomic hydrogen, which changes in amount with the progress of cleaning or conditioning, is measured and monitored from the spectrums.

For example, in the step S1 serving as an extraneous deposit removing stage, the light emission of SiN from plasma at a wavelength of 440.7 nm is monitored by the detecting unit 60 to detect the residual quantity of extraneous deposits inside the chamber 1, so that endpoint detection is performed for the extraneous deposit removing stage. In place of SiN or atomic hydrogen, the light emission of SiF, F, or HF may be monitored to perform the endpoint detection in the same way.

Further, in the step S2 serving as a fluorine removing stage, the light emission of atomic hydrogen from plasma at 656.3 nm is monitored by the detecting unit 60 to detect the residual quantity of fluorine inside the chamber 1. As described above, residual fluorine inside the chamber 1 reacts with hydrogen to generate HF, which is then exhausted out of the chamber 1. As the amount of persisting fluorine is larger, hydrogen is consumed more inside the chamber 1, and the light emission of atomic hydrogen is lower. Accordingly, in the step S2 serving as a fluorine removing stage, atomic hydrogen supplied into the chamber is monitored, so that the amount of fluorine inside the chamber 1 is indirectly known. Alternatively, HF may be monitored to detect the residual quantity of fluorine.

Further, in the step S3 serving as a hydrogen removing stage, the light emission of atomic hydrogen from plasma at 656.3 nm is monitored by the detecting unit 60 to detect the residual quantity of atomic hydrogen inside the chamber 1, thereby performing endpoint detection.

Figure 5:
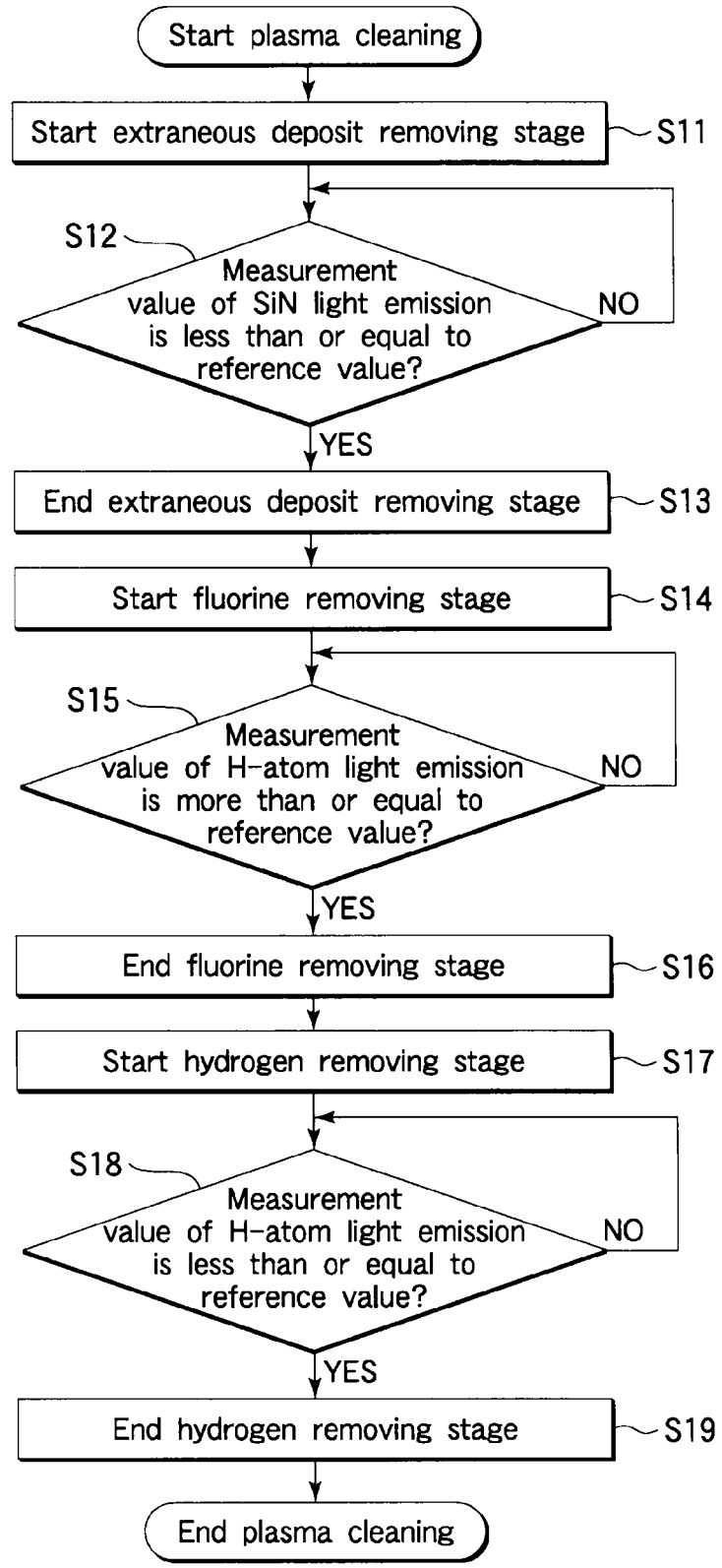
FIG. 5 This is a flow chart showing an example of the process sequence of the plasma cleaning process with endpoint detection.

FIG. 5 is a flow chart showing an example of the sequence of a case where plasma light emission is measured by the detecting unit 60 in the cleaning process to determine the endpoint of each of the extraneous deposit removing stage, fluorine removing stage, and hydrogen removing stage. In this embodiment, under the control of the process controller 50, the endpoint of each stage is determined and switching to the subsequent stage is automatically performed. No explanation will be given of the contents of the respective stages, because they have already been described.

At first, in response to an input of an instruction to start the cleaning process, which is given by an operator through the user interface 51, control signals are transmitted from the process controller 50 to the respective portions of the plasma processing apparatus 100 to start the extraneous deposit removing stage (step S11). During the extraneous deposit removing stage, the light emission (440.7 nm) of SiN from plasma is measured by the detecting unit 60, and measurement values are successively transmitted to the process controller 50. Further, a reference value concerning the light emission (440.7 nm) of SiN, which is preset as an indicating value of the endpoint of the extraneous deposit removing stage, is read out from the storage section 52 by the process controller 50. Each measurement value from the detecting unit 60 is compared with the reference value by the process controller 50 to make a judgment of whether the measurement value is less than or equal to the reference value (step S12). Where the measurement value of the SiN light emission is judged as being less than or equal to the reference value in the step S12, control signals are transmitted from the process controller 50 to the respective portions of the plasma processing apparatus 100 to end the extraneous deposit removing stage by, e.g., stopping the supply of microwaves and stopping the supply of gases (step S13). On the other hand, where the measurement value of the SiN light emission is judged as being more than the reference value in the step S12, the process of the extraneous deposit removing stage is kept continued because removal of the extraneous deposits is still insufficient. The judgment of the step S12 is repeated until the measurement value of the SiN light emission becomes less than or equal to the reference value.

After the extraneous deposit removing stage is ended in the step S13, control signals are transmitted from the process controller 50 to the respective portions of the plasma processing apparatus 100 to start the fluorine removing stage (step S14). During the fluorine removing stage, the light emission (656.3 nm) of atomic H from plasma is measured by the detecting unit 60, and measurement values are successively transmitted to the process controller 50. Further, a reference value concerning the light emission (656.3 nm) of atomic H, which is preset as an indicating value of the endpoint of the fluorine removing stage, is read out from the storage section 52 by the process controller 50. Each measurement value from the detecting unit 60 is compared with the reference value by the process controller 50 to make a judgment of whether the measurement value is more than or equal to the reference value (step S15). Where the measurement value of the atomic H light emission is judged as being more than or equal to the reference value in the step S15, control signals are transmitted from the process controller 50 to the respective portions of the plasma processing apparatus 100 to end the fluorine removing stage by, e.g., stopping the supply of microwaves and stopping the supply of gases (step S16). On the other hand, where the measurement value of the atomic H light emission is judged as being less than the reference value in the step S15, the process of the fluorine removing stage is kept continued. The judgment of the step S15 is repeated until the measurement value of the atomic H light emission becomes more than or equal to the reference value.

After the fluorine removing stage is ended in the step S16, control signals are transmitted from the process controller 50 to the respective portions of the plasma processing apparatus 100 to start the hydrogen removing stage (step S17). During the hydrogen removing stage, the light emission (656.3 nm) of atomic H from plasma is measured by the detecting unit 60, and measurement values are successively transmitted to the process controller 50. Further, a reference value concerning the light emission (656.3 nm) of atomic H is read out from the storage section 52 by the process controller 50. Each measurement value from the detecting unit 60 is compared with the reference value by the process controller 50 to make a judgment of whether the measurement value is less than or equal to the reference value (step S18). Where the measurement value of the atomic H light emission is judged as being less than or equal to the reference value in the step S18, control signals are transmitted from the process controller 50 to the respective portions of the plasma processing apparatus 100 to end the hydrogen removing stage by, e.g., stopping the supply of microwaves and stopping the supply of gas (step S19). On the other hand, where the measurement value of the atomic H light emission is judged as being more than the reference value in the step S18, the process of the hydrogen removing stage is kept continued. The judgment of the step S18 is repeated until the measurement value of the atomic H light emission becomes less than or equal to the reference value.

In this way, all the stages of the plasma cleaning process are ended. According to this embodiment, plasma light emission is monitored by the detecting unit 60 to perform endpoint detection for each of the stages of the plasma cleaning process (extraneous deposit removing stage, fluorine removing stage, and hydrogen removing stage), whereby the time periods of the stages can be properly managed. Consequently, it is possible to prevent plasma damage from being caused due to a plasma process excessively performed, to prevent particles being generated due to a plasma process insufficiently performed, and to prevent film formation from being adversely affected, thereby providing a beneficial cleaning effect along with low plasma damage.

Further, particularly where an insulating film (such as $Si_3N_4$ or $SiO_2$) with a high stress is formed in the plasma processing apparatus 100, and an insulating film of this kind is deposited on portions inside the chamber, the film cannot keep in close contact with the portions inside the chamber but can easily peel off due to the high stress of the film. Consequently, particles are generated and make it difficult to continuously perform the process on wafers W. In this case, cleaning of portions inside the chamber needs to be performed every time one or several wafers W are processed to form the insulating film.

Figure 6:
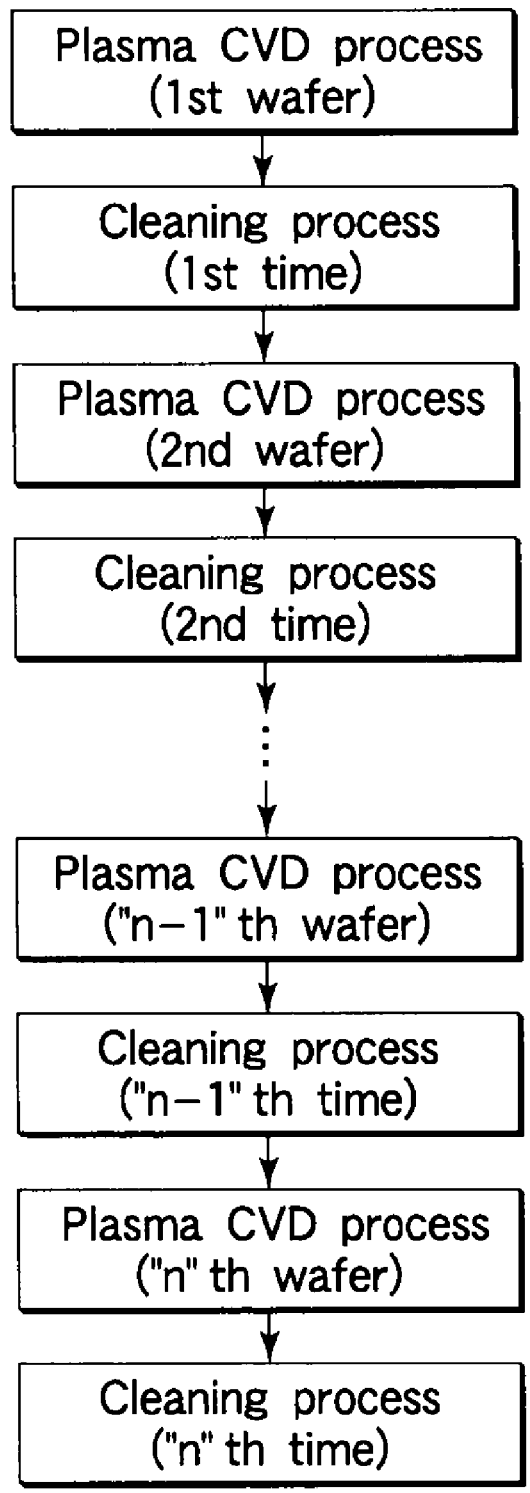
FIG. 6 This is a flow chart showing an example of the process sequence of a plasma CVD method including a plasma cleaning method according to the present invention.

FIG. 6 is a view for explaining the sequence of a plasma CVD method in which a plasma cleaning process is performed between repetitions of a plasma CVD process. For example, the plasma CVD process is performed on at least one wafer W, and then the cleaning process is performed for the first time. This cleaning process may be performed in accordance with the sequence of the step S1 to step S3 shown in FIG. 4, wherein the step S2 serving as a fluorine remove process and the step S3 serving as a hydrogen remove process may be repeated, as in the example. Where an insulating film with a high stress is formed, cleaning is preferably performed every time one or several wafers W are processed because particles can be easily generated in this case.

After the cleaning for the first time is finished, for example, the plasma CVD process is performed again on the second wafer W, and then the cleaning process is performed again. In this way, the plasma CVD process and in-situ cleaning process are alternately performed, so that extraneous deposits on portions inside the chamber 1 can be reliably removed before they peel off and generate particles. Consequently, film formation process can be stably continued while particle generation is suppressed to the minimum.

Next, an explanation will be given of results of experiments performed to confirm effects of the present invention.

Figure 7:
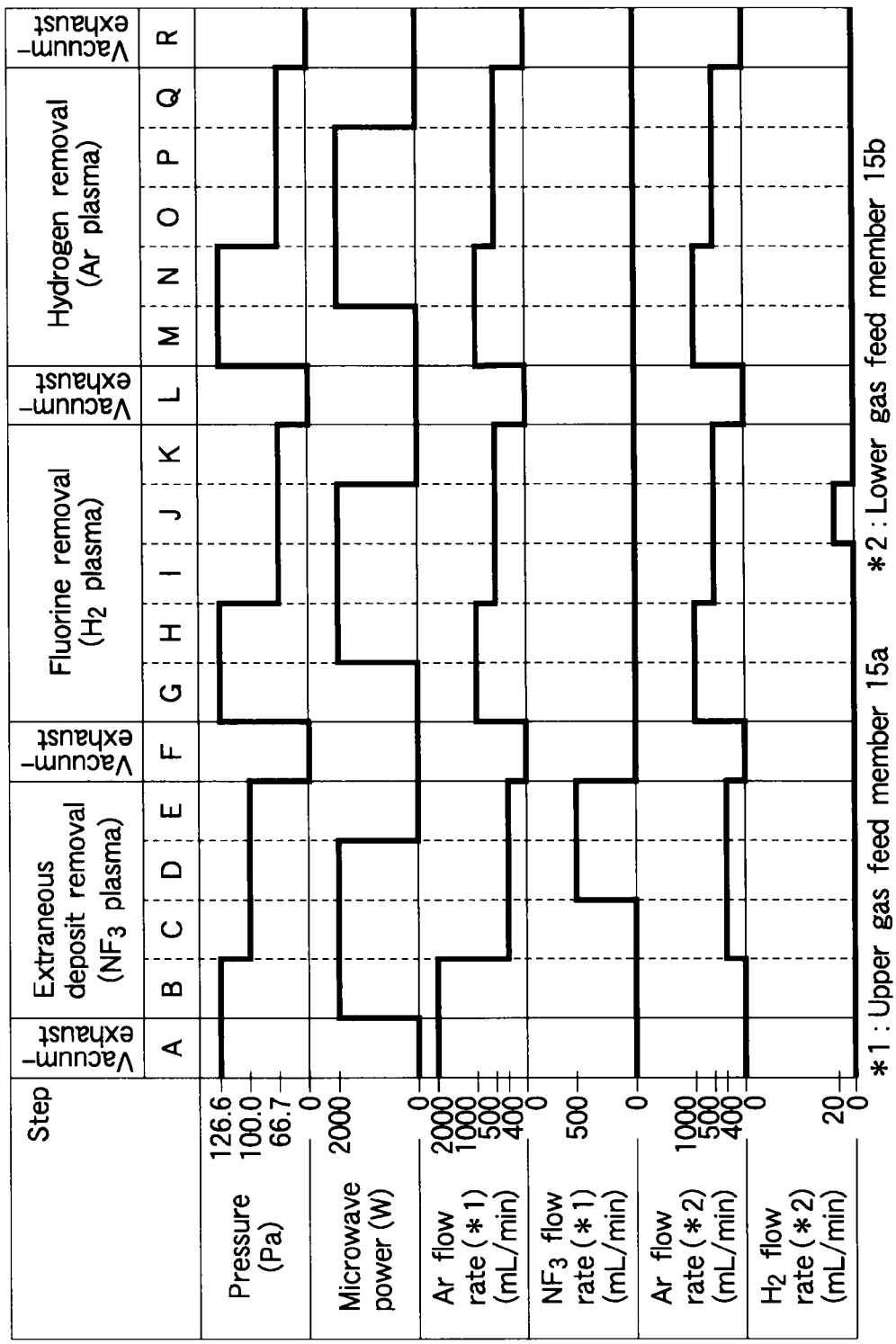
FIG. 7 This is a timing chart showing a plasma CVD process of a film formation apparatus according to an experimental example.

At first, in the plasma processing apparatus 100, a film formation process of a silicon nitride film was performed on a 300-mm wafer W, and extraneous deposits were formed with a thickness of about 500 nm on portions inside the chamber 1. In this state, a plasma cleaning process was performed under conditions described below. FIG. 7 shows set conditions in detail, such as gas flow rates and process pressures used in this experiment. In this experiment, $NF_3$ gas was supplied from the upper gas feed part 15a and $H_2$ gas was supplied from the lower gas feed part 15b, but these gas feed positions could be reversed.

<Plasma Cleaning Conditions>
(1) Extraneous Deposit Removing Stage:
Ar gas flow rate (gas feed part 15a); 400 mL/min (sccm),
Ar gas flow rate (gas feed part 15b); 400 mL/min (sccm),
$NF_3$ gas flow rate (gas feed part 15a); 500 mL/min (sccm),
Process pressure; 100 Pa (750 mTorr),
Process temperature; 500° C.,
Microwave power density; 1.67 W/cm$^2$,
Microwave power; 2,000 W, and
Process time; 15 minutes.
(2) Fluorine Removing Stage:
Ar gas flow rate (gas feed part 15a); 500 mL/min (sccm),
Ar gas flow rate (gas feed part 15b); 500 mL/min (sccm),
$H_2$ gas flow rate (gas feed part 15b); 20 mL/min (sccm),
Process pressure; 66.7 Pa (500 mTorr),
Process temperature; 500° C.,
Microwave power density; 1.67 W/cm$^2$,
Microwave power; 2,000 W, and
Process time; 10 minutes.
(3) Hydrogen Removing Stage:
Ar gas flow rate (gas feed part 15a); 500 mL/min (sccm),
Ar gas flow rate (gas feed part 15b); 500 mL/min (sccm),
Process pressure; 66.7 Pa (500 mTorr),
Process temperature; 500° C.,
Microwave power density; 1.67 W/cm$^2$,
Microwave power; 2,000 W, and
Process time; 3 minutes.

In this hydrogen removing stage, the ON/OFF of the microwave output was switched, such that a cyclic process was performed while Ar gas plasma was intermittently generated at intervals of 180 seconds inside the chamber 1.

As shown in the timing chart of FIG. 7, the extraneous deposit removing stage using $NF_3$ plasma was formed of steps B to E, the fluorine removing stage using $H_2$ plasma was formed of steps G to K, and the hydrogen removing stage using Ar plasma was formed of steps M to Q. Before and after the respective stages, vacuum-exhaust was performed (step A, step F, step L, and step R). Further, in each of the stages, the step B, step H, or step N of plasma ignition (tuned on the microwave power) was arranged to set the pressure inside the chamber at 126.6 Pa higher than the pressure used in the cleaning conditions, so that plasma was easily generated. Then, in the step C, step I, or step O, the process pressure was lowered to the pressure used in the cleaning conditions, so that the gas flow rates were stabilized. Then, in the subsequent step D, step J, or step P, plasma was turned on to perform plasma cleaning.

Figure 8A:
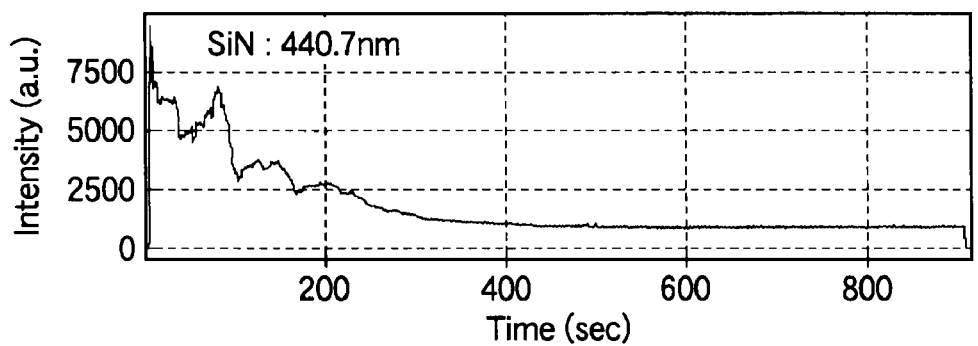
FIG. 8A This is a view showing the SiN emission spectrum of plasma measured in the extraneous deposit removing stage of the plasma cleaning process.
Figure 8B:
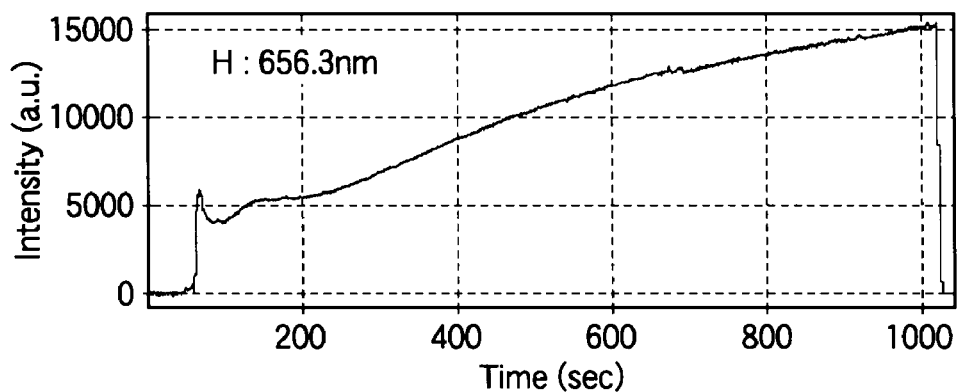
FIG. 8B This is a view showing the atomic hydrogen emission spectrum of plasma measured in the fluorine removing stage of the plasma cleaning process.
Figure 8C:
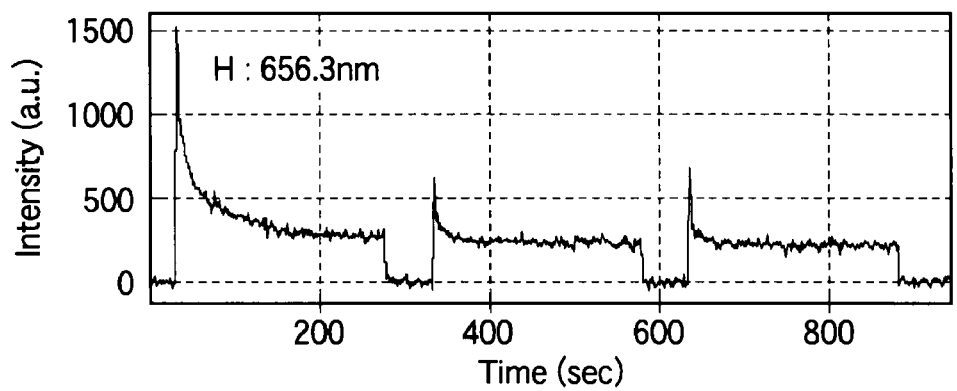
FIG. 8C This is a view showing the atomic hydrogen emission spectrum of plasma measured in the hydrogen removing stage of the plasma cleaning process.

In the extraneous deposit removing stage, the light emission intensity of SiN in plasma at a wavelength of 440.7 nm was monitored by the detecting unit 60 to perform endpoint detection. In the fluorine removing stage, the light emission intensity of hydrogen in plasma at a wavelength of 656.3 nm was monitored by the detecting unit 60 to perform endpoint detection. In the hydrogen removing stage, the light emission intensity of hydrogen in plasma at a wavelength of 656.3 nm was monitored by the detecting unit 60 to perform endpoint detection. FIG. 8A to 8C show emission spectrums obtained in the respective stages (the vertical axis denotes the normalized light emission intensity).

As shown in FIG. 8A, with the elapse of the time of the process using $Ar/NF_3$ gas plasma, the light emission intensity of SiN in plasma was decreased and then stabilized. Accordingly, the extraneous deposit removing stage was judged as arriving at the endpoint when the light emission intensity of SiN in plasma became less than or equal to a preset reference value. According to visual observation, almost all extraneous deposits (SiN) on portions inside the chamber 1 were removed when the light emission intensity becomes, e.g., less than or equal to 1,000. The extraneous deposit removing stage may be judged as arriving at the endpoint when the light emission intensity of SiN in plasma is stabilized at a value less than or equal to the reference value (for example, the inclination of the tangent line relative to the emission spectrum becomes less than or equal to a predetermined value). Further, the extraneous deposit removing stage may be judged as arriving at the endpoint by visual observation.

As shown in FIG. 8B, with the elapse of the time of the process using $Ar/H_2$ gas plasma, the light emission intensity of atomic hydrogen in plasma was increased. This represents that hydrogen was increased in reverse proportion to a decrease in fluorine inside the chamber 1 because hydrogen was consumed by a reaction with fluorine (HF generation). Accordingly, the fluorine removing stage was judged as arriving at the endpoint when the light emission intensity of atomic hydrogen in plasma became more than or equal to a preset reference value (for example, more than or equal to 6,000). The fluorine removing stage may be judged as arriving at the endpoint when the light emission intensity of atomic hydrogen in plasma is stabilized at a value more than or equal to the reference value (for example, the inclination of the tangent line relative to the emission spectrum becomes less than or equal to a predetermined value).

As shown in FIG. 8C, with the elapse of the time of the process using Ar gas plasma, the light emission intensity of atomic hydrogen in plasma was decreased and then stabilized at an almost constant level after repetitions of the cycle. This represents that hydrogen was decreased inside the chamber 1 because hydrogen inside the chamber was dissociated by sputtering of Ar gas plasma and exhausted out of the chamber 1. Accordingly, the hydrogen removing stage was judged as arriving at the endpoint when the light emission intensity of atomic hydrogen in plasma became less than or equal to a preset reference value (for example, less than or equal to 250). The hydrogen removing stage may be judged as arriving at the endpoint when the light emission intensity of atomic hydrogen in plasma is stabilized at a value less than or equal to the reference value (for example, the inclination of the tangent line relative to the emission spectrum becomes less than or equal to a predetermined value). This hydrogen removing stage is preferably repeated at least twice.

As shown in the results described above, it has been found that, where the interior of the chamber 1 of the plasma processing apparatus 100 is first processed by use of Ar/NF$_3$ gas plasma, the extraneous deposits are efficiency removed. Further, it has been found that, where the interior of the chamber 1, from which the extraneous deposits have been removed, is processed by use of Ar/H$_2$ gas plasma, the residual fluorine is efficiency removed. Further, it has been found that, where the interior of the chamber 1 is thereafter processed by Ar gas plasma, the residual hydrogen is effectively removed. Consequently, the plasma cleaning process according to this embodiment makes it possible to efficiently clean the interior of the chamber 1 of the plasma processing apparatus 100 used for plasma CVD.

The present invention is not limited to the embodiment described above, and it may be modified in various manners.

For example, the plasma processing apparatus 100 shown in FIG. 1 is used such that a plasma CVD process is performed inside chamber 1 and then plasma of a cleaning gas is excited in situ. Alternatively, for example, a cleaning process may be performed by use of a remote plasma system such that plasma of a cleaning gas is excited outside the chamber 1 of the plasma processing apparatus 100 and is supplied into the chamber 1.

Further, in the embodiment described above, the plasma processing apparatus 100 is exemplified by the RLSA type, but a cleaning method according to the present invention may be applied to a plasma processing apparatus of another type, such as the remote plasma type, ICP plasma type, ECR plasma type, surface reflection wave plasma type, and magnetron plasma type.

Further, the cleaning is applied to a case where a film formation process of a silicon nitride film (SiN film) is performed in the plasma processing apparatus 100. Alternatively, the cleaning may be applied to a case where another film is formed, such as silicon oxide (SiO$_2$) film, poly-silicon film, tungsten (W) film, tungsten silicide (WSi) film, titanium (Ti) film, titanium nitride (TiN) film, tantalum (Ta) film, or tantalum nitride (TaN) film.

In the plasma cleaning method according to the embodiment described above, the extraneous deposit removing stage is arranged to use NF$_3$ gas. Alternatively, plasma cleaning may be performed such that extraneous deposits on portions inside the chamber are removed by use of another halogen-containing gas, such as Cl$_2$, HCl, or ClF$_3$. Also in this case, a halogen removing stage using H$_2$ is performed thereafter and is followed by a hydrogen removing stage using a rare gas, such as Ar, as need.

The invention claimed is:

1. A plasma CVD method for depositing a silicon nitride film on a surface of a target substrate inside a process container of a plasma CVD apparatus, the method comprising:

performing a film formation process on a first product substrate placed inside the process container to form a silicon nitride film on a substrate surface by CVD, wherein the film formation process includes supplying a process gas including a nitrogen-containing gas and a silicon-containing gas and generating plasma of the process gas;

performing the film formation process on a second product substrate placed inside the process container; and performing a cleaning process inside the process container with extraneous deposits deposited therein due to the film formation process, after the film formation process on the first product substrate and before the film formation process on the second product substrate, wherein the cleaning process includes:

a first step of supplying a rare gas, which is selected from the group consisting of Ar gas, Kr gas, Xe gas, and He gas, and NF$_3$ gas into the process container, without supplying any other gas into the process container, and generating plasma of the rare gas and plasma of the NF$_3$ gas inside the process container to remove the extraneous deposits present inside the process container by a plasma process, the first step ending with a first exhaust period of vacuum-exhausting the process container without supplying the NF$_3$ gas in to the process container and without generating any plasma inside the process container;

a second step of supplying the rare gas and hydrogen gas into the process container, without supplying any other gas into the process container, and generating plasma of the rare gas and plasma of the hydrogen gas inside the process container to remove residual fluorine inside the process container by a plasma process after the first step, the second step ending with a second exhaust period of vacuum-exhausting the process container without supplying the hydrogen gas in to the process container and without generating any plasma inside the process container; and a third step of supplying the rare gas into the process container, without supplying any other gas into the process container, and generating plasma of the rare gas inside the process container to remove residual hydrogen inside the process container by a plasma process after the second step, the third step ending with a third exhaust period of vacuum-exhausting the process container without generating any plasma inside the process container.

2. The plasma CVD method according to claim 1, wherein, after the first step, the cleaning process alternately repeats the second step and the third step without performing the first step.

3. The plasma CVD method according to claim 1, wherein the plasma CVD apparatus is arranged to radiate microwaves into the process container through a plurality of slots of a planar antenna disposed at an upper side of the process container, and the method generates plasma by microwaves radiated through the planar antenna in each of the film formation process and the first, second, and third steps of the cleaning process.

4. The plasma CVD method according to claim 3, wherein the cleaning process includes switching on- and off-states of microwave for generating plasma at predetermined time intervals in one or both of the second and third steps.

5. The plasma CVD method according to claim 3, wherein the plasma CVD apparatus includes upper and lower nozzles disposed above a substrate table inside the process container such that the upper nozzle is closer to the planar antenna than the lower nozzle is, and the cleaning process uses the upper and lower nozzles to supply the rare gas from both of the upper and lower nozzles in each of the first, second, and third steps and to supply the NF$_3$ gas and the hydrogen gas from one of the upper and lower nozzles in the first and second steps, respectively.

6. The plasma CVD method according to claim 1, wherein the rare gas is Ar gas.

7. The plasma CVD method according to claim 1, wherein each of the first, second, and third exhaust periods is made without supplying the rare gas in to the process container.

8. The plasma CVD method according to claim 1, wherein the second step sets a flow rate ratio of the hydrogen gas relative to the rare gas at a value of 0.0025 to 0.33.

9. The plasma CVD method according to claim 1, wherein each of the first, second, and third steps is performed at a process temperature of 400 to 600° C.

10. The plasma CVD method according to claim 1, wherein, as compared with the first step, each of the second and third steps generates plasma at a lower output energy so that damage to the process container is smaller.

11. The plasma CVD method according to claim 1, wherein the first step first generates only plasma of the rare gas at a first initial pressure and then generates plasma of the $NF_3$ gas along with plasma of the rare gas at a first cleaning pressure lower than the first initial pressure, and the second step first generates only plasma of the rare gas at a second initial pressure and then generates plasma of the hydrogen gas along with plasma of the rare gas at a second cleaning pressure lower than the second initial pressure.

12. The plasma CVD method according to claim 1, wherein the cleaning process is performed while a dummy substrate is placed on a portion inside the process container, which is configured to place each of the first and second product substrates thereon.

13. The plasma CVD method according to claim 1, wherein each of the first, second, and third steps includes monitoring light emission inside the process container due to a corresponding plasma process to perform endpoint detection for the corresponding plasma process.

14. The plasma CVD method according to claim 13, wherein the first step monitors light emission intensity of SiN to perform endpoint detection and each of the second and third steps monitors light emission intensity of H to perform endpoint detection.

* * * * *